United States Patent
Cheng

(10) Patent No.: US 8,339,786 B2
(45) Date of Patent: Dec. 25, 2012

(54) HEAT DISSIPATION DEVICE

(75) Inventor: Nien-Tien Cheng, Taipei Hsien (TW)

(73) Assignee: Foxconn Technology Co., Ltd., New Taipei (TW)

(*) Notice: Subject to any disclaimer, the term of this patent is extended or adjusted under 35 U.S.C. 154(b) by 175 days.

(21) Appl. No.: 12/981,556

(22) Filed: Dec. 30, 2010

(65) Prior Publication Data

US 2012/0075805 A1 Mar. 29, 2012

(30) Foreign Application Priority Data

Sep. 23, 2010 (TW) ................. 99132137 A

(51) Int. Cl.
*H05K 7/20* (2006.01)
(52) U.S. Cl. ............. 361/700; 361/679.47; 361/679.52; 361/679.55; 165/80.3; 165/104.14; 165/104.26; 165/104.33
(58) Field of Classification Search .......... 361/679.46–679.55, 700–703, 361/688, 689; 165/80.2–80.5, 104.14, 104.26, 165/104.21, 104.26 M, 104.33, 185; 257/713–718; 29/890.03, 890.032, 890.045, 890.039; 174/15.1, 174/16.3, 252; 62/259.2
See application file for complete search history.

(56) References Cited

U.S. PATENT DOCUMENTS

| | | | | |
|---|---|---|---|---|
| 5,646,822 A | * | 7/1997 | Bhatia et al. | 361/679.27 |
| 5,847,925 A | * | 12/1998 | Progl et al. | 361/679.47 |
| 6,889,755 B2 | * | 5/2005 | Zuo et al. | 165/104.26 |
| 6,958,912 B2 | * | 10/2005 | Pokharna et al. | 361/700 |
| 7,987,898 B2 | * | 8/2011 | Meng et al. | 165/80.3 |
| 2004/0159422 A1 | * | 8/2004 | Zuo et al. | 165/104.14 |
| 2005/0082033 A1 | * | 4/2005 | Huang et al. | 165/80.3 |
| 2006/0137862 A1 | * | 6/2006 | Huang et al. | 165/104.33 |

FOREIGN PATENT DOCUMENTS

JP 363143491 A * 6/1988

* cited by examiner

*Primary Examiner* — Michail V Datskovskiy
(74) *Attorney, Agent, or Firm* — Altis Law Group, Inc.

(57) ABSTRACT

An exemplary heat dissipation device for a portable electronic device includes a heat pipe and a heat dissipating member. The heat pipe includes an evaporator section and a condenser section. The evaporator section is attached to a heat source of the portable electronic device. The heat dissipating member includes a sheath, and a porous heat dissipating layer and a working fluid contained in the sheath. The porous heat dissipating layer defines gaps therein. The working fluid is filled in the gaps. The condenser section of the heat pipe is received in the porous heat dissipating layer and thermally contacts the porous heat dissipating layer.

10 Claims, 6 Drawing Sheets

HEAT DISSIPATION DEVICE

BACKGROUND

1. Technical Field

The present disclosure generally relates to heat dissipation of electronic apparatuses, and particularly to a heat dissipation device for portable electronic devices.

2. Description of Related Art

Portable electronic devices, such as tablet personal computers, mobile telephones and others often present a compact structure with powerful functionality. During operation, considerable heat is easily accumulated, risking overheating and damage. Numerous heat dissipation devices for such portable electronic devices have already been developed. The demand for new and improved heat dissipation devices is ongoing.

Accordingly, what is needed is an effective heat dissipation device for portable electronic devices.

BRIEF DESCRIPTION OF THE DRAWINGS

Many aspects of the disclosed embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the views.

DETAILED DESCRIPTION

Figure 1:
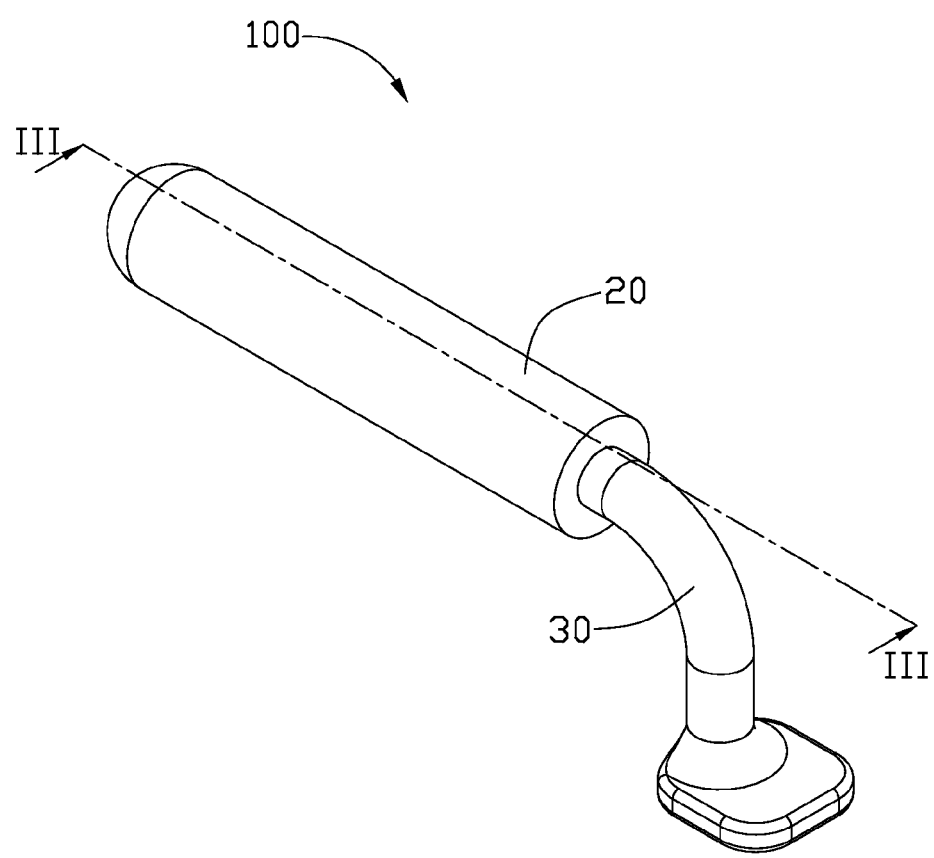
FIG. 1 is an isometric, assembled view of a heat dissipation device for a portable electronic device according to a first embodiment of the present disclosure.
Figure 2:
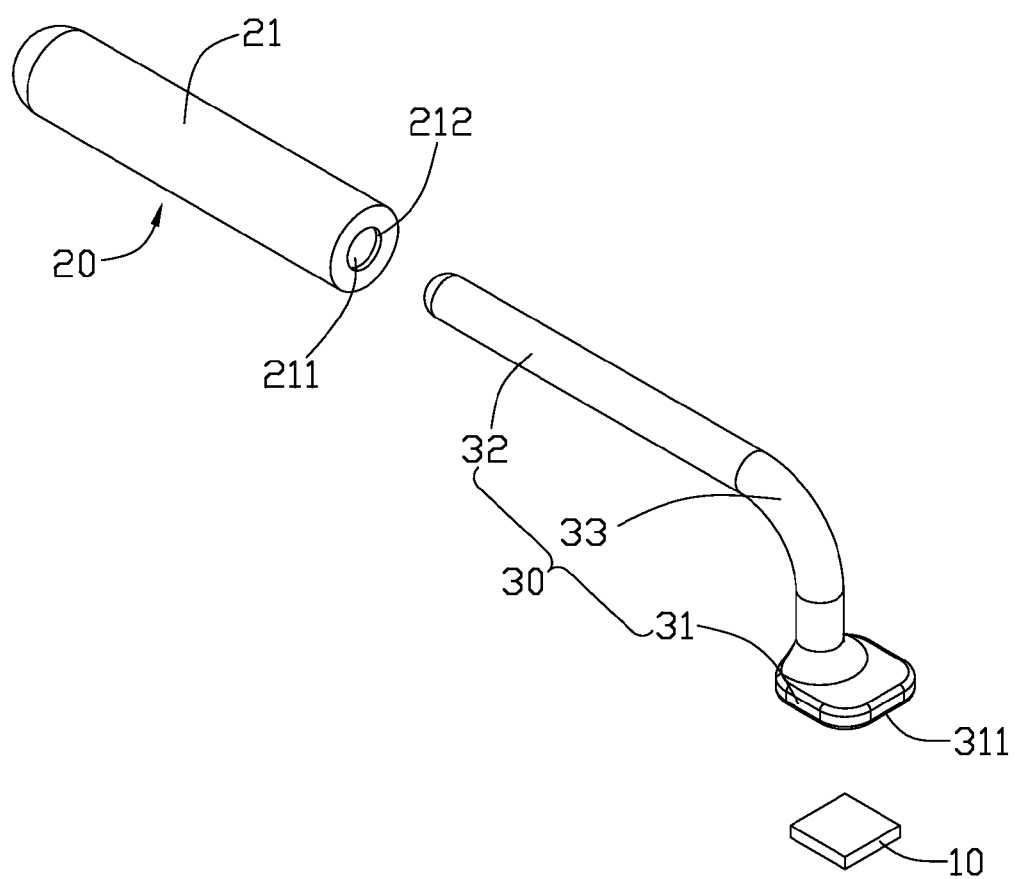
FIG. 2 is an exploded view of the heat dissipation device of FIG. 1.
Figure 3:
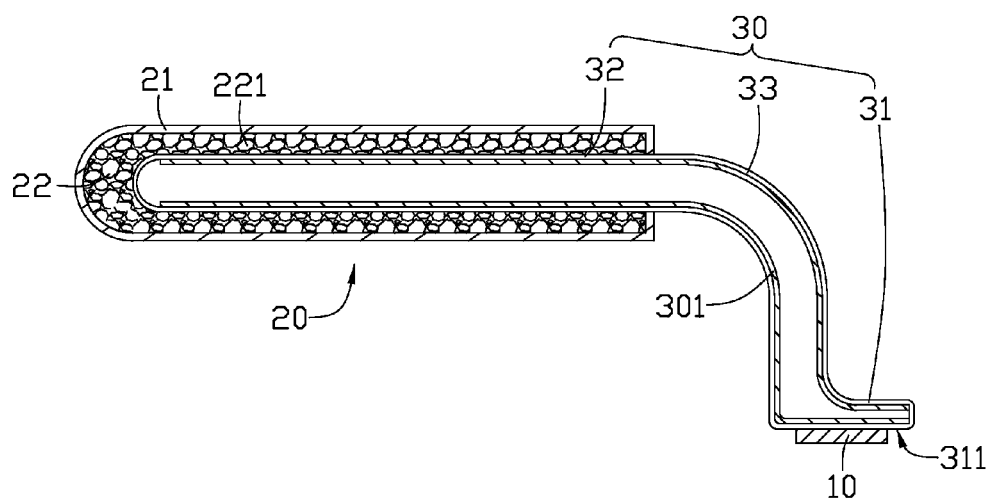
FIG. 3 is a cross-section of the heat dissipation device of FIG. 1, taken along line III-III thereof.

Referring to FIGS. 1 to 3, a heat dissipation device 100 for a portable electronic device (not shown) according to a first embodiment of the present disclosure is shown. The heat dissipation device 100 dissipates heat from a heat source 10 in the portable electronic device. The heat source 10 may for example be a processor. The heat dissipation device 100 includes a heat dissipating member 20, and a heat pipe 30 thermally connecting the heat source 10 with the heat dissipating member 20.

The heat pipe 30 transfers heat of the heat source 10 to the heat dissipating member 20. The heat pipe 30 is a bent, elongated vacuum pipe filled with an appropriate quantity of working fluid of low boiling point, such as water, alcohol, or other.

A wick structure 301 lines an inner wall of the heat pipe 30. The heat pipe 30 includes an evaporator section 31 connected to a condenser section 32 by a connecting section 33.

The evaporator section 31 is block-shaped and hollow. A rectangular contacting surface 311 is provided at a bottom of the evaporator section 31. The contacting surface 311 is intimately in contact with a top surface of the heat source 10. The connecting section 33 is a bent pipe segment. One end of the connecting section 33 is connected with a top of the evaporator section 31 and communicates with an inside of the evaporator section 31. Another end of the connecting section 33 is connected with one end of the condenser section 32 and communicates with an inside of the condenser section 32. The condenser section 32 is a straight pipe segment. An opposite end of the condenser section 32 is sealed. The condenser section 32 is attached to the heat dissipation member 20.

The heat dissipating member 20 includes a sheath 21, and a porous heat dissipating layer 22 contained in the sheath 21. The sheath 21 is filled with an appropriate quantity of heat conductive working fluid (not shown), such as water, mercury, or other.

The sheath 21 is made of one or more heat conductive materials, such as copper, and is capable of transferring heat from an interior to an exterior thereof. In this embodiment, the sheath 21 is hollow and cylindrical. A receiving space 211 is defined in the sheath 21. One end of the sheath 21 is sealed; and before assembly of the heat dissipation device 100, an opposite end of the sheath 21 is open with an entrance 212 defined thereat. The receiving space 211 communicates with the exterior via the entrance 212. The entrance 212 is circular. A diameter of the entrance 212 is equal to an outer diameter of the condenser section 32 of the heat pipe 30. The condenser section 32 is received in the receiving space 211 of the sheath 21 through the entrance 212, and seals the entrance 212. The condenser section 32 can be further soldered at the entrance 212 of the sheath 21.

The porous heat dissipating layer 22 is made of porous material or sintered heat conductive powder, such as copper powder. The porous heat dissipating layer 22 defines a plurality of randomly distributed gaps 221 therein. The gaps 221 communicate with each other, and contain the working fluid. Sizes of the gaps 221 are determined according to a heat dissipating requirement of the heat source 10. The porous heat dissipating layer 22 and the working fluid are sealed in the receiving space 211 of the sheath 21 and surround the condenser section 32 of the heat pipe 30, providing requisite thermal contact with the condenser section 32.

During operation of the heat dissipation device 100, heat generated by the heat source 10 is transferred to the condenser section 32 of the heat pipe 30 through the evaporator section 31 of the heat pipe 30. The porous heat dissipation layer 22 and the working fluid of the heat dissipation member 20, which surround the condenser section 32 of the heat pipe 30, absorb the heat of the condenser section 32. The working fluid of the heat dissipation member 20 flows through the gaps 221 of the porous heat dissipating layer 22 to cooperatively transfer the heat from the condenser section 32 to the sheath 21. Then the heat is dissipated to the exterior from the sheath 21.

In the above-described embodiment, the heat dissipation member 20 is provided with a porous heat dissipation layer 22 and working fluid therein, and the porous heat dissipation layer 20 defines a plurality of gaps 211 therein. A size and a configuration of the porous heat dissipation layer 22 are easily adjusted during manufacture, providing adaptability for the porous heat dissipation layer 22. For example, the porous heat dissipation layer 22 can be squeezed, cut, and/or bent during manufacture. Whatever the particular size and/or configuration of the porous heat dissipation layer 22, an appropriate quantity of the working fluid is contained in the heat dissipation member 20 and the heat dissipation layer 22. Therefore whatever the particular size(s) and/or configuration(s) of the gaps 221, the working fluid can appropriately fill the gaps 221. Thus in use of the heat dissipation device 100, prompt and uninterrupted heat transfer between the heat source 10 and the sheath 21 of the heat dissipation member 20 is ensured.

The heat dissipation device 100 is typically used in portable electronic devices without fans, such as tablet personal computers, mobile telephones, and others. Noise pollution caused by a fan is thus avoided, and the additional driving power required for the fan is also unnecessary. Furthermore, the sheath 21 of the heat dissipation member 20 is hollow and cylindrical, providing good flexibility during machining. Thus, the sheath 21 of the heat dissipation member 20 can be staved or angled to satisfy different systems.

Figure 4:
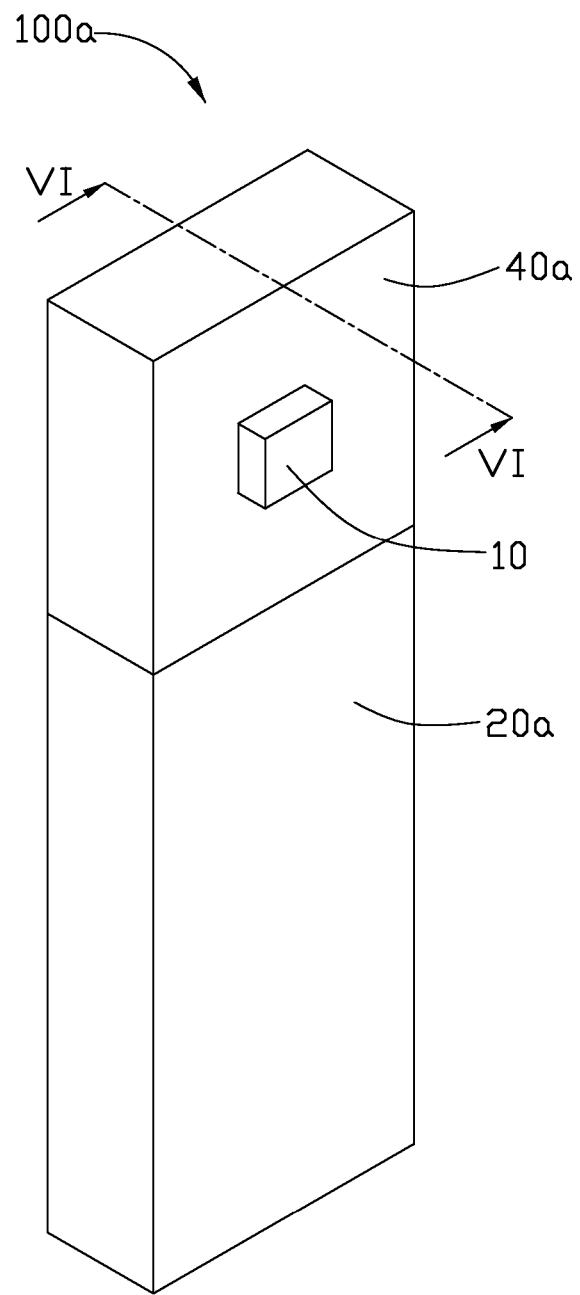
FIG. 4 is an isometric, assembled view of a heat dissipation device for a portable electronic device according to a second embodiment of the present disclosure.
Figure 5:
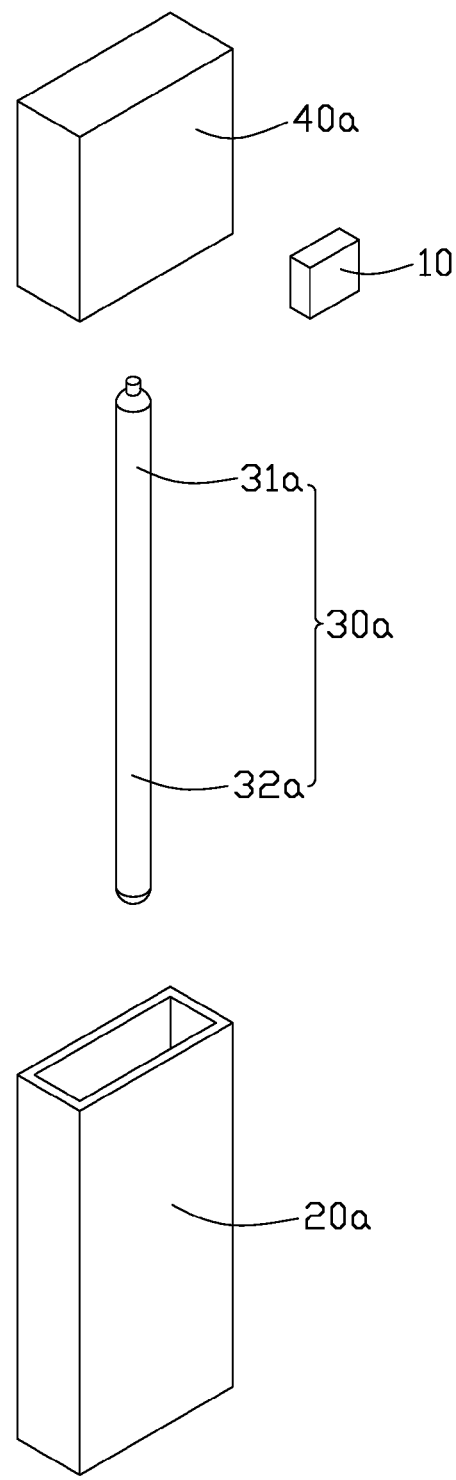
FIG. 5 is an exploded view of the heat dissipation device of FIG. 4.
Figure 6:
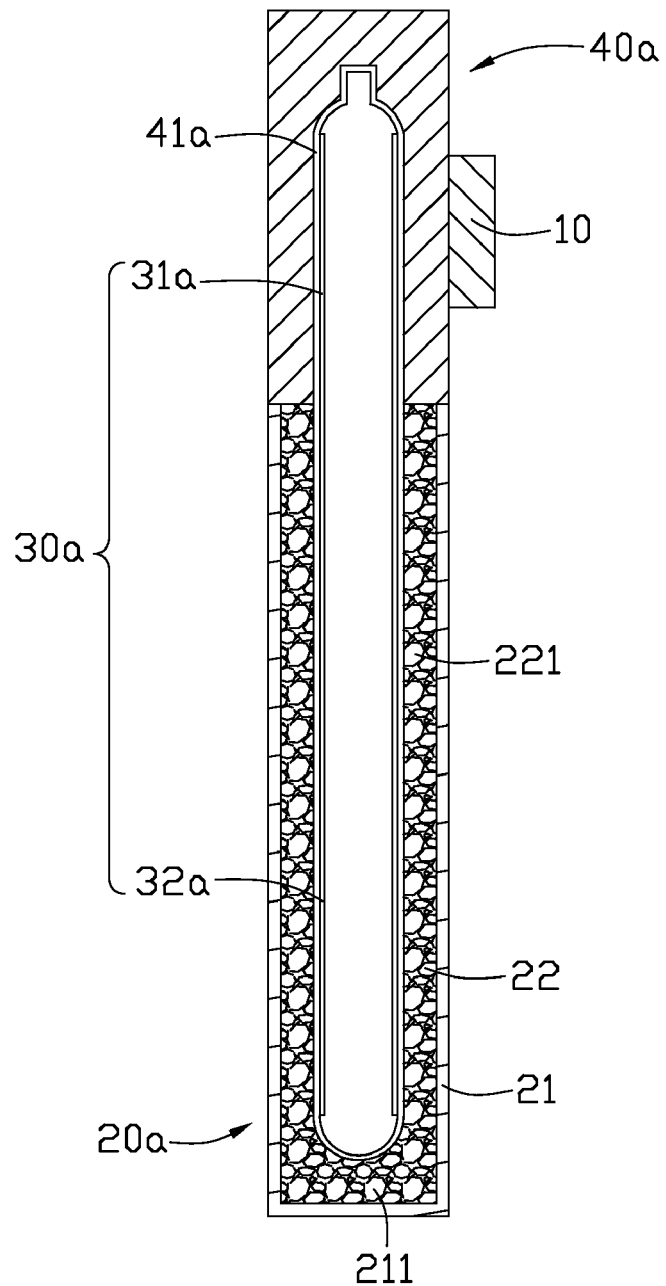
FIG. 6 is a cross-section of the heat dissipation device of FIG. 4, taken along line VI-VI thereof.

FIGS. 4 to 6 show a heat dissipation device 100a according to a second embodiment. The heat dissipation device 100a differs from the heat dissipation device 100 of the first embodiment as follows. A sheath 21a of a heat dissipation member 20a has a cuboid profile. Before assembly of the heat dissipation device 100a, one end of the sheath 21a is sealed, and the other end is open. A heat pipe 30a of the heat dissipation device 100a is elongated and straight. The heat pipe 30a includes an evaporator section 31a, and a condenser section 32a connecting and communicating with the evaporator section 31a. The condenser section 32a is received in the heat dissipation member 20a through the open end of the sheath 21a. The heat dissipation device 100a further includes a heat spreading plate 40a. The heat spreading plate 40a has a cuboid profile, and defines a receiving hole 41a therein. A diameter of the receiving hole 41a is equal to an outer diameter of the evaporator section 31a of the heat pipe 30a. The evaporator section 31a of the heat pipe 30a is received in the receiving hole 41a and intimately contacts the heat spreading plate 40a. A thickness of the heat spreading plate 40a is equal to that of the sheath 21a of the heat dissipation member 20a. The heat spreading plate 40a blocks the open end of the sheath 21a and seals the sheath 21a. The heat spreading plate 40a is attached on the heat source 10, evenly transferring heat generated by the heat source 10 to the heat pipe 30a.

It is to be understood that even though numerous characteristics and advantages of the embodiments have been set forth in the foregoing description, together with details of the structures and functions of the embodiments, the disclosure is illustrative only; and changes may be made in detail, especially in matters of shape, size, and arrangement of parts within the principles of the invention to the full extent indicated by the broad general meaning of the terms in which the appended claims are expressed.

What is claimed is:

1. A heat dissipation device for a portable electronic device, the heat dissipation device comprising:
    a heat pipe comprising an evaporator section and a condenser section, the evaporator section being configured for thermally attaching to a heat source of the portable electronic device; and
    a heat dissipating member comprising a sheath, and a porous heat dissipating layer and a working fluid contained in the sheath, the porous heat dissipating layer defining a plurality of gaps therein, the working fluid filled in the gaps, the condenser section of the heat pipe being received in the porous heat dissipating layer and thermally contacting the porous heat dissipating layer;
    wherein the porous heat dissipating layer and the working fluid surround the condenser section of the heat pipe;
    wherein the sheath is hollow and cylindrical; and
    wherein the sheath defines a receiving space therein, the porous heat dissipating layer and the working fluid are received in the receiving space, the sheath further defines an entrance, a diameter of the entrance is equal to that of an outer diameter of the condenser section of the heat pipe, and the condenser section is received in the receiving space through the entrance and seals the entrance.

2. The heat dissipation device of claim 1, wherein the porous heat dissipating layer is made of one of porous material and sintered heat conductive powder.

3. The heat dissipation device of claim 1, wherein the heat pipe further comprises a connecting section connecting the evaporator section with the condenser section, the evaporator section is block-shaped and hollow and is provided with a contacting surface thereon, the connecting section extends at an angle from the evaporator section, and the condenser section is a straight pipe segment.

4. A heat dissipation device for a portable electronic device, the heat dissipation device comprising:
    a heat pipe comprising an evaporator section and a condenser section, the evaporator section configured for thermally attaching to a heat source of the portable electronic device; and
    a heat dissipating member comprising a sheath, a porous heat dissipating layer lining an inner wall of the sheath, and working fluid, the porous heat dissipating layer defining a plurality of gaps therein, the working fluid filled in the gaps, the condenser section of the heat pipe received in and thermally contacting the porous heat dissipating layer;
    wherein the porous heat dissipating layer and the working fluid surround the condenser section of the heat pipe; and
    wherein the heat pipe further comprises a connecting section connecting the evaporator section with the condenser section, the evaporator section is block-shaped and hollow and is provided with a contacting surface thereon, the connecting section extends at an angle from the evaporator section, and the condenser section is a straight pipe segment.

5. The heat dissipation device of claim 4, wherein the porous heat dissipating layer is made of one of porous material and sintered heat conductive powder.

6. The heat dissipation device of claim 4, wherein the sheath is hollow and cylindrical.

7. The heat dissipation device of claim 6, wherein the sheath defines a receiving space therein, the porous heat dissipating layer and the working fluid are received in the receiving space, the sheath further defines an entrance, a diameter of the entrance is equal to that of an outer diameter of the condenser section of the heat pipe, and the condenser section is received in the receiving space through the entrance and seals the entrance.

8. A heat dissipation device for a portable electronic device, the heat dissipation device comprising:
    a heat pipe comprising an evaporator section and a condenser section, the evaporator section being configured for thermally attaching to a heat source of the portable electronic device;
    a heat spreading plate, wherein the evaporator section of the heat pipe is configured for thermally attaching to the heat source through the heat spreading plate; and
    a heat dissipating member comprising a sheath, and a porous heat dissipating layer and a working fluid contained in the sheath, the porous heat dissipating layer defining a plurality of gaps therein, the working fluid filled in the gaps, the condenser section of the heat pipe being received in the porous heat dissipating layer and thermally contacting the porous heat dissipating layer;

wherein the porous heat dissipating layer and the working fluid surround the condenser section of the heat pipe.

9. The heat dissipation device of claim 8, wherein the sheath is hollow and cuboid, one end of the sheath is sealed, an opposite end of the sheath is open, the condenser section of the heat pipe is received in the heat dissipation member through the open end of the sheath, and the heat spreading plate blocks the open end of the sheath and seals the sheath.

10. The heat dissipation device of claim 8, wherein the heat spreading plate defines a receiving hole therein, a diameter of the receiving hole is equal to an outer diameter of the evaporator section of the heat pipe, and the evaporator section is received in the receiving hole.

* * * * *